United States Patent [19]

Ballato et al.

[11] Patent Number: 4,990,818

[45] Date of Patent: Feb. 5, 1991

[54] METHOD OF MAKING A TRANSDUCER FROM A BOULE OF LITHIUM TETRABORATE AND TRANSDUCER SO MADE

[75] Inventors: Arthur Ballato, Long Branch; John A. Kosinski, Wall Township, Monmouth County, both of N.J.

[73] Assignee: The United States of America as represented by the Secretary of the Army, Washington, D.C.

[21] Appl. No.: 425,539

[22] Filed: Oct. 23, 1989

[51] Int. Cl.$^5$ ............................................. H01K 41/08
[52] U.S. Cl. ................................................... 310/360
[58] Field of Search ............................ 310/313 A, 360

[56] References Cited

U.S. PATENT DOCUMENTS

| | | | |
|---|---|---|---|
| 4,523,119 | 6/1985 | Whatmore et al. | 310/313 A |
| 4,634,913 | 1/1987 | Whatmore et al. | 310/360 X |
| 4,672,255 | 6/1987 | Suzuki et al. | 310/313 A |
| 4,772,817 | 9/1988 | Aida et al. | 310/360 X |
| 4,950,937 | 8/1990 | Ballato et al. | 310/360 |

Primary Examiner—Mark O. Budd
Attorney, Agent, or Firm—Michael Zelenka; Roy E. Gordon

[57] ABSTRACT

An improved transducer is obtained by providing a plate of lithium tetraborate with a doubly rotated orientation of $\phi \approx 17°$ to 21° and $\theta \approx 54°$ to 58° where doubly rotated orientations are described by the IEEE notation widely known in the art as (YXwl)$\phi/\theta$.

2 Claims, No Drawings

METHOD OF MAKING A TRANSDUCER FROM A BOULE OF LITHIUM TETRABORATE AND TRANSDUCER SO MADE

The invention described herein may be manufactured, used, and licensed by or for the Government for governmental purposes without the payment to us of any royalty thereon.

This invention relates in general to a method of making a temperature compensated transducer and to the transducer so made, and in particular to a method of making a temperature compensated transducer from a boule of lithium tetraborate and to the transducer so made.

BACKGROUND OF THE INVENTION

In U.S. patent application Ser. No. 07/406,933 filed Sept. 13, 1989 by A. Ballato and J. A. Kosinski for "Method of Making a Resonator From A Boule of Lithium Tetraborate and Resonator So Made" and assigned to a common assignee and with which this application is copending, there is disclosed and claimed a method of making a resonator from a boule of lithium tetraborate. The method includes the steps of:

(A) orienting the boule with respect to its crystallographic axis and cutting the boule into parallel plates having a doubly rotated orientation of $\phi \cong 38°$ to $42°$ and $\theta \cong 30°$ to $36°$ where doubly rotated orientations are described by the IEEE notation widely known in the art as $(Yxwl)\phi/\theta$, (B) lapping and polishing a plate from step (A) and depositing metallic electrodes onto the major surfaces of that plate; and (C) mounting the plate in an evacuated sealed enclosure to form a resonator and subjecting the resonator to an alternating voltage across the electrodes at a frequency that piezoelectrically excites the fundamental harmonic of the thickness extensional mode.

Though highly desireable in its attributes for the thickness extensional mode, the method of Ser. No. 07/406,933 does not work for shear mode applications. In this connection, there are many instances where it is desireable to use the shear mode, as for example, in measuring the shear elastic constants of composite materials and superlattices.

SUMMARY OF THE INVENTION

The general object of this invention is to provide a transducer characterized by frequency insensitivity to temperature variations. A more particular object of the invention is to provide a transducer in which both the first- and the second order temperature coefficient of frequency are substantially zero. Another object of the invention is to provide a transducer in which the piezoelectric coupling is large. Still another object of the invention is to provide a transducer in which the piezoelectric coupling is large for the thickness shear mode of vibration.

It has now been found that the aforementioned objects can be attained by providing a transducer in which $Li_2B_4O_7$ is oriented with respect to its crystallographic axes to form a plate having a doubly rotated orientation of $\phi \cong 17°$ to $21°$ and $\theta \cong 54°$ to $58°$ where doubly rotated orientations are described by the IEEE notation widely known in the art as $(YXwl)\phi/\theta$ and in which the plate is lapped and polished and metallic electrodes then deposited on the major surfaces of the plate, the plate then mounted in an evacuated sealed enclosure to form a transducer and the transducer subjected to an alternating voltage across the electrodes at a frequency that piezoelectrically excites the fundamental harmonic of the thickness shear mode.

In lieu of a transducer, the method of the invention is applicable to resonators, oscillators, filters, signal processors for radar and communications and the like. Whereas, previously, $Li_2B_4O_7$ exhibited good temperature behavior with poor piezo effect or good piezo effect with poor temperature behavior, the present invention provides $Li_2B_4O_7$ with both good temperature behavior with large piezo effect.

PREFERRED EMBODIMENT

A transducer is desired for the purposes of measuring the shear elastic constants of a gallium arsenide/gallium aluminum arsenide superlattice. To obtain such a transducer a $Li_2B_4O_7$ plate transducer having a doubly rotated orientation of $\phi \cong 19°$ and $\theta \cong 56°$ is used. The transducer is circular in outline with a diameter of 10 millimeters and thickness of about 0.1 millimeter. The transducer is driven at the fundamental harmonic of the thickness shear mode which occurs at approximately 16 megaherts. This resonance has an effective piezoelectric coupling factor of approximately 27 percent, and the first- and the second-order temperature coefficients of frequency are negligible.

As can be seen from the above embodiment, the heart of the invention lies in the discovery of the values for the two angles $\phi$ and $\theta$ specifying the doubly rotated orientation at which the fundamental harmonic of the thickness shear mode has simultaneously, vanishingly small values of the first- and second-order temperature coefficients of frequency.

Doubly rotated orientations are described by the IEEE notation widely known in the art as $(YXwl) \phi/\theta$.

We wish it to be understood that we do not desire to be limited to the exact details of construction shown and described for obvious modifications will occur to a person skilled in the art.

What is claimed is:

1. In a transducer including a lapped and polished plate of lithium tetraborate with metallic electrodes deposited on the major surfaces of the plate and the plate mounted in an evacuated sealed enclosure, the improvement of providing the plate with a doubly rotated orientation of $\phi \cong 17°$ to $21°$ and $\theta \cong 54°$ to $58°$ where doubly rotated orientations are described by the IEEE notation widely known in the art as $(YXwl)\phi/\theta$.

2. In a transducer according to claim 1, the improvement of providing the plate with a doubly rotated orientation of $\phi \cong 19°$ and $\theta \cong 56°$.

* * * * *